United States Patent [19]

Rhyu

[11] Patent Number: 5,928,822
[45] Date of Patent: Jul. 27, 1999

[54] METHOD FOR CONFIRMING OPTIMUM FOCUS OF STEPPER

[75] Inventor: Dal Lae Rhyu, Ichon-shi, Rep. of Korea

[73] Assignee: Hyundai Electronics Industries Co., Ltd., Kyoungki-do, Rep. of Korea

[21] Appl. No.: 08/940,402

[22] Filed: Oct. 1, 1997

[30] Foreign Application Priority Data

Oct. 2, 1996 [KR] Rep. of Korea .................. 96-43632

[51] Int. Cl.$^6$ ....................................... G03F 9/00
[52] U.S. Cl. ............................... 430/30; 430/22
[58] Field of Search .......................... 430/22, 30

[56] References Cited

U.S. PATENT DOCUMENTS

| | | |
|---|---|---|
| 4,581,316 | 4/1986 | Yamanouchi ..................... 430/296 |
| 5,338,630 | 8/1994 | Yoon et al. ........................ 430/30 |
| 5,677,091 | 10/1997 | Barr et al. ........................ 430/22 |
| 5,756,238 | 5/1998 | Barr et al. ........................ 430/22 |
| 5,776,645 | 7/1998 | Barr et al. ........................ 430/22 |

*Primary Examiner*—Christopher G. Young
*Attorney, Agent, or Firm*—Thelen Reid & Priest LLP

[57] ABSTRACT

A method for confirming an optimum focus of a stepper. A plurality of photoresist patterns are formed at a predetermined energy while changing focus by use of a reticle of a diagonally asymmetric box-in-box structure. The optimum focus can be obtained by taking advantage of the change of the line width of the photoresist patterns with defocus degrees.

2 Claims, 1 Drawing Sheet

METHOD FOR CONFIRMING OPTIMUM FOCUS OF STEPPER

BACKGROUND OF THE INVENTION

1. Field of the Invention

The present invention relates, in general, to a method for confirming an optimum focus of a stepper in the fabrication of semiconductor device and, more particularly, to taking advantage of the change of the line width of a photoresist pattern with the position of the focus of the light to which the photoresist pattern is exposed at a predetermined exposure energy, thereby confirming an optimum focus.

2. Description of the Prior Art

When the fabrication of a semiconductor device is carried out by a lithography process, it is reasonable that the accurately precise transcription of the image of a reticle upon the photoresist film formed on a wafer is necessary to give a desired photoresist pattern. For this, accurate information concerning how images are formed in accordance with steppers is required, and this work is usually recognized as the confirmation of an optimum focus.

Conventionally, in order to confirm an optimum focus, photoresist patterns which are the same in dimension and shape, e.g. hole or bar, are formed on a test wafer by difference in offset value. Since the photoresists are, then, examined with an optical microscope. At this time, an offset value is detected from the pattern which looks to be optimally shaped.

This conventional method, however, has a serious problem in that differences may occur according to the resolution power of the optical microscope and to the investigators.

SUMMARY OF THE INVENTION

It is therefore an object of the present invention to overcome the above problems encountered in the prior arts and to provide a method for confirming an optimum focus of a stepper with ease under the little influence of investigator's error or apparatus's performance.

In accordance with the present invention, the above object could be accomplished by a provision of a method for confirming an optimum focus of a stepper; comprising the steps of: forming various photoresist patterns at a predetermined exposure energy while changing focus by use of a reticle, said reticle having a box-in-box structure in which regular squares are arranged with concentricity and intersected by a diagonal line and being equipped with chrome patterns at individual positions of an inner box and an outer box at the left lower side of the diagonal line and with chrome patterns at a space between the inner box and the outer box at the right upper side of the diagonal line; and measuring the space distance between said outer box and said inner box and the line width of the photoresist patterns formed in the space region between said outer box and said inner box.

BRIEF DESCRIPTION OF THE DRAWINGS

The above and other objects and aspects of the invention will become apparent from the following description of embodiments with reference to the accompanying drawings in which.

DETAILED DESCRIPTION OF THE INVENTION

The application of the preferred embodiments of the present invention is best understood with reference to the accompanying drawings.

Figure 1:
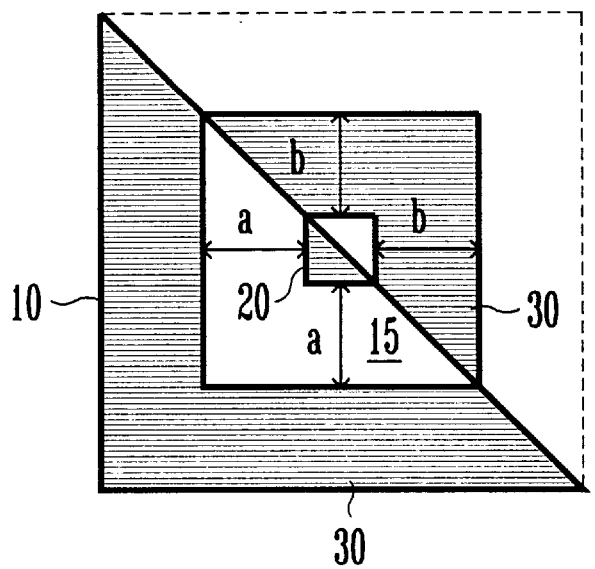
FIG. 1 is a plan view of a reticle used to confirm whether a photoresist pattern formed after an exposure and developing process has an optimum focus, in accordance with the present invention.

Referring to FIG. 1, there are chrome patterns formed on a reticle for easily confirming whether a photoresist pattern formed after an exposure and developing process has an optimum focus.

As shown in FIG. 1, a box-in-box structure in which regular squares are arranged with concentricity is intersected by a diagonal line. At the left lower side of the diagonal line, chrome patterns 30 are constructed at individual positions of an inner box 20 and an outer box 10 to measure an overlay degree conventionally. At the right upper side of the diagonal line, chrome patterns 30 are formed at a space 15 between the inner box 20 and the outer box 10.

Figure 2:
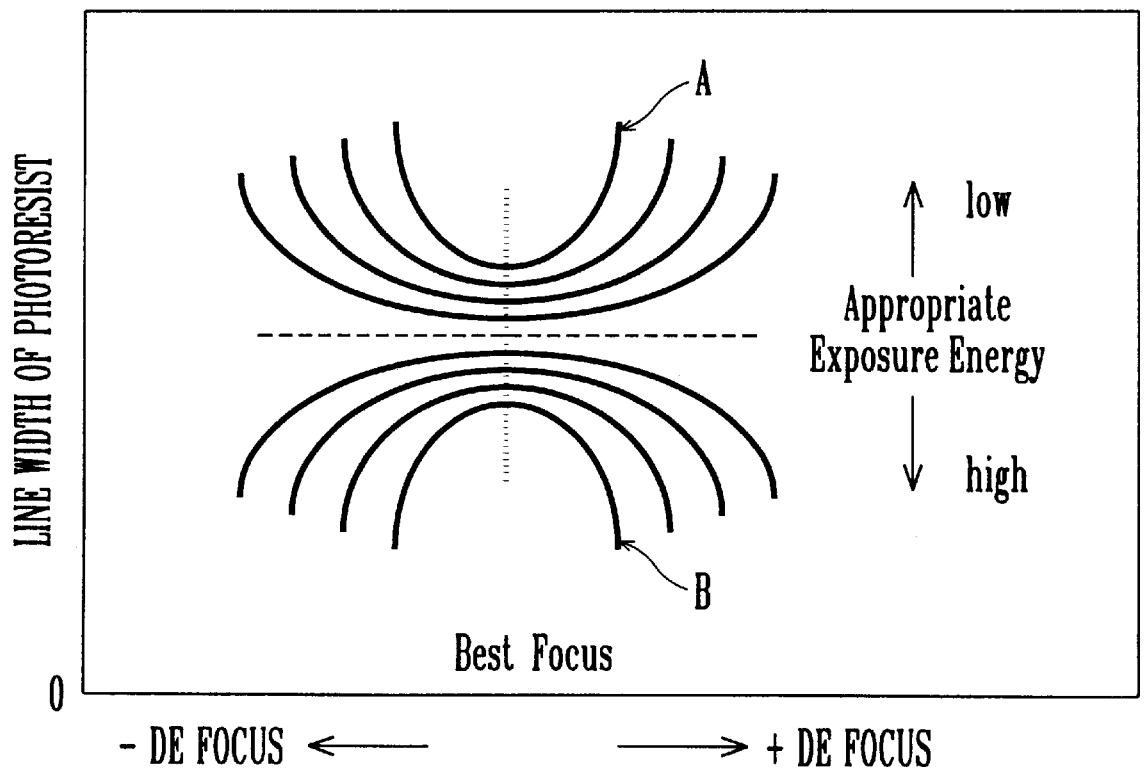
FIG. 2 is a Boson's curve showing the change of the line width of photoresist pattern with defocus progress in + and − directions when a photoresist film is exposed at a larger or smaller exposure energy than an appropriate one.

FIG. 2 is a Boson's curve, showing how the line width of photoresist is changed with the defocus progress in the + and − directions when a photoresist with a predetermined thickness is exposed at exposure energies smaller or larger than an appropriate one.

In this figure, character "A" denotes that the line width of photoresist increases as progress occurs from an optimum focus to defocus in + and − directions, upon exposure with a smaller energy than an appropriate one. While character "B" denotes that the line width of photoresist decreases with the change from an optimum focus to defocus in + and − directions, upon exposure with a larger energy than an appropriate one.

For using the reticle of FIG. 1 to form a photoresist pattern, a space distance a between the photoresist patterns formed in the outer box 10 and the inner box 20 and a line width b of the photoresist pattern formed in the space 15, both are change with the position of the defocus as shown in FIG. 2. Accordingly, after various photoresist patterns are formed while changing the focus by use of the reticle, if the spacer distance a and the line width b are measured by an apparatus, e.g. a metrology apparatus, and compared with each other, the degree of defocus progress in a + or − direction can be detected. Therefore, it can be informed of how a control is taken to obtain an optimum focus.

In the state of an optimum focus, the space distance a is the same with the line width b of photoresist pattern. Under a defocus in a + or − direction, the space distance a becomes broad but the line width b becomes narrow when the exposure energy used is larger than an appropriate one. Whereas the space distance a becomes narrow and the line width b becomes broad when using a smaller exposure energy than an appropriate one.

As described hereinbefore, an optimum focus of a stepper can be obtained by forming various photoresist patterns by use of the reticle of the present invention while changing focuses, detecting the space distance and the line width of the photoresist patterns by use of an apparatus (e.g. a metrology apparatus) to determine a defocused degree and correcting it.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for confirming an optimum focus of a stepper, the method comprising:

a) forming various photoresist patterns at a predetermined exposure energy while changing focus by use of a reticle, wherein:
      1) said reticle has a box-in-box structure in which regular squares are concentrically arranged and intersected by a diagonal line; and
      2) said reticle is equipped with chrome patterns at individual positions of an inner box and an outer box at the left lower side of the diagonal line; and
      3) said reticle is equipped with chrome patterns at a space between the inner box and the outer box at the right upper side of the diagonal line; and
   b) measuring a space distance between said outer box and said inner box, and a line width of the photoresist patterns formed in the space region between said outer box and said inner box;

wherein, to confirm the optimum focus:

A) the space distance broadens and the line width narrows when a defocus progresses to a + or − direction in a larger exposure energy than an optimum exposure energy; or B) the space distance narrows and the line width broadens when a defocus progresses to the + or − direction in a smaller exposure energy than the optimum exposure energy.

2. A method in accordance with claim 1, wherein:

said optimum focus is obtained when said space distance is the same as the line width of the photoresist patterns.

* * * * *